United States Patent [19]

Oppel

[11] 4,130,762
[45] Dec. 19, 1978

[54] ARRANGEMENT FOR THE AUTOMATIC HEATING AND ADJUSTMENT OF A TREATMENT TEMPERATURE FOR THE TREATMENT OF WORKPIECES BY MEANS OF GLOW DISCHARGE

[75] Inventor: Werner Oppel, Cologne, Fed. Rep. of Germany

[73] Assignee: Kloeckner Ionon GmbH, Cologne, Fed. Rep. of Germany

[21] Appl. No.: 769,162

[22] Filed: Feb. 16, 1977

[30] Foreign Application Priority Data

Feb. 18, 1976 [DE] Fed. Rep. of Germany ....... 2606396

[51] Int. Cl.$^2$ ............................................... B01K 1/00
[52] U.S. Cl. ................................. 250/531; 307/310; 307/362; 323/19
[58] Field of Search ................. 250/531, 535; 323/19; 307/310, 362; 178/16.5, 16.6; 266/87

[56] References Cited

U.S. PATENT DOCUMENTS

| | | | |
|---|---|---|---|
| 2,884,511 | 4/1959 | Berghaus et al. | 315/252 |
| 2,916,409 | 12/1959 | Bucek | 250/547 |
| 3,260,892 | 7/1966 | Berghaus et al. | 315/308 |
| 3,389,070 | 6/1968 | Berghaus et al. | 250/531 |
| 3,579,029 | 5/1971 | Spescha et al. | 324/24 |
| 3,686,557 | 8/1972 | Futamura | 323/19 |

*Primary Examiner*—Benjamin R. Padgett
*Assistant Examiner*—Deborah L. Kyle
*Attorney, Agent, or Firm*—Michael J. Striker

[57] ABSTRACT

An apparatus for controlling the treatment temperature of a workpiece processed in a current intensive glow discharge container, comprises a differentiator for deriving at its output a time derivative of the actual treatment temperature in the glow discharge container, a comparator for generating a control value corresponding to the difference between the time derivative and a preset desired value, and a current regulator controlled by the control value at the output of the comparator.

7 Claims, 2 Drawing Figures

Fig.1
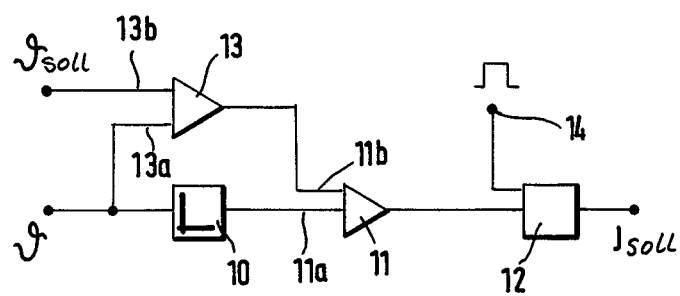
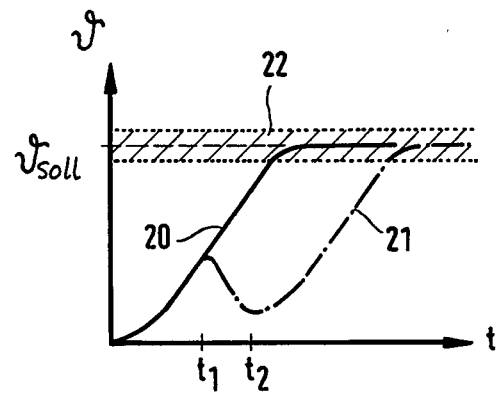
Fig.2

ARRANGEMENT FOR THE AUTOMATIC HEATING AND ADJUSTMENT OF A TREATMENT TEMPERATURE FOR THE TREATMENT OF WORKPIECES BY MEANS OF GLOW DISCHARGE

The present invention relates to the automatic heating and adjustment of a prescribed treatment temperature by the treating of workpieces by means of current-intensive glow discharge in a container, and the temperature of a workpiece is measured in the container.

The use of current-intensive glow discharge for the treatment of workpieces particularly for nitrogen-hardening, plating, annealing, hardening, carburizing, decarburizing or the like is long since known, compare for example the U.S. Pat. Nos. 2,916,409, 3,389,070, or 3,260,892. Hereby the workpieces in a container are heated on account of impingement of the ions on the upper surface of the workpieces in an initial heating process, afterwhich the specific treatment occurs, by which the workpieces are maintained as much as possible to a specified temperature and by which for example by nitrogen-hardening nitrogen atoms diffuse into the outer surface of the workpieces in order to prepare in this manner a hardening of the outer surface. Arcing which occurs eventually during the entire process and which can disadvantageously influence the workpieces is continuously switched off for example by a switch, as is described in the U.S. Pat. No. 3,579,029. Hereby the operating current is momentarily switched off, however after a short time interval, in which an occurring arc is normally extinguished, is again switched on.

A method for the automatic heating and adjusting of the specified treatment temperature during the treatment of workpieces by means of current-intensive glow discharge is known from the U.S. Pat. No. 2,884,511, by which a control arrangement is dealt with, in which the electrical energy which is supplied to the workpieces according to a predetermined program specifying parameters and variation overtime, which program is automatically executed according to a settable pattern and in a specified sequence, as long as no spontaneous changes in the discharge, i.e., arcing, occurs in the glow discharge. Herein processing is stepwise, and a supervisory control member must be provided for the occurrence of spontaneous changes of the glow discharge, by means of which the specified program is stopped or recycled. Such stepwise programming control is connected on the one hand with a very large technical cost, and on the other hand no completely continuous control of the temperature arrangement results and no gapless continuation of the heating-or adjustment steps for the treatment temperature occurs for an interruption of the glow discharge by the occurrence of arcs.

It is therefore an object of the present invention to provide a method and an arrangement of the above-mentioned type which requires a relatively small technical expense, and to make possible a completely continuous control and a gapless continuation of the heating- or setting steps for the treatment temperature during an interruption of the glow discharge.

This object is thereby achieved in that the time derivative of the temperature is formed and is compared with a specified value for the formation of a comparison value, while the current corresponding to the comparison value is readjusted, and is controlled to this value after achieving the specified treatment temperature.

Advantageously the readjustment of the current proceeds continuously.

Hereby it is especially advantageous to re-establish the current after the occurrence of discharge disturbances such as arcing, and after extinguishment of the disturbance to further continue the heating.

In this manner a continuous curve results of the temperature rise relative to the time, whereby the treatment is further continued even in the event of a long shut-off of the glow discharge for the instantaneous temperature of the workpieces in the container, so that only a parallel displacement of the curve results due to cooling of the workpieces in the container. Thereby an extremely uniform starting of the glow-discharge process, which is relatively free of disturbances by arcing, is guaranteed.

Furthermore an apparatus for performing the process also forms part of the subject matter of the invention, and is characterized by a differentiator which is connected to one or more measuring points for the temperature, which is subsequently connected to a comparator whose other input is connected with an apparatus which supplies a desired value, which apparatus supplies a negative desired value upon exceeding the treatment temperature, and is connected with a current controller at the output of the comparator.

It is hereby especially advantageous to use a PI-regulator with an especially long integral action time as a current regulator in order to effect a lengthy readjustment of the current. The current regulator can comprise an additional input through which impulses are suppliable for the reduction of the current upon the occurrence of discharge disturbances as arcing. These impulses can originate for example by a quick-break switch which is known from U.S. Pat. No. 3,579,029. The arrangement supplying the desired value can have a comparator whose first input is connected with the other of the temperature measuring points and whose second input is connected with an adjustable fixed specified desired value for the treatment temperature. Preferably the arrangement which supplies the desired value has an amplifier, whose first input is connected with the other of the temperature measuring points and whose second input is connected with an adjustable fixed predetermined desired value for the treatment temperature, which amplifier goes into saturation upon large input voltage differences, i.e. acts as a comparator, while at smaller input voltage differences the amplifier also acts as such and whose output signal in this case then approaches the temperature of its desired value and goes toward zero. Thereby a smooth build-up of the rise curve is achieved for the treatment temperature to the desired value without an oscillation about the desired value.

The invention is more closely explained as follows with the aid of the attached Figures.

FIG. 1 shows an embodiment of the apparatus in accordance with the invention.

FIG. 2 shows a diagram for the temperature time curve for the control of the treatment temperature by means of the apparatus of FIG. 1.

The apparatus illustrated in FIG. 1 comprises a differentiator 10 whose input is connected with one or more measuring points for the temperature $\theta$ of the workpieces in the container. The output of the differentiator 10 is connected with an input 11a of a comparator 11, whose other input 11b is connected with an arrangement which supplies a desired value. The latter comprises a comparator 13, from which an input 13a is connected with the other of the measuring points for the temperature, while the other input 13b is connected with an adjustable fixed specified desired value for the treatment temperature. The output of the comparator 13 is conducted to the input 11b of the comparator 11.

An operational amplifier is used especially as a comparator 13 (correspondingly true for the comparator 11), which goes into saturation for large input voltage differences, i.e. acts as a comparator, while for smaller input voltage differences, namely when the temperature $\theta$ approaches the desired value $\theta_{desired}$, supplies a signal going towards zero. When $\theta - \theta_{desired}$ the output voltage of the amplifier 13 is approximately zero. If in addition the time derivative of the temperature d $\theta$/dt is equal to zero then the output of the amplifier 11 is likewise zero.

The desired value $\Delta\theta$ supplied by the amplifier 13 is compared with the time derivative of the temperature d $\theta$/dt by means of a comparator 11, and the output signal of the comparator is supplied to a current controller 12, which is formed especially as a PI-regulator with a long integral action time. The PI-regulator 12 lengthens and continuously increases the current for an output signal at the comparator 11, thereby the occurrence of arcing in the container is not produced by immediate current changes.

Impulses for the reduction of the current are supplied to the PI-regulator 12 advantageously upon the occurrence of arcs, and these impulses are produced preferably by a switch operative in response to arcs, as is described in U.S. Pat. No. 3,579,029, which is connected with an input terminal 14 of the PI-regulator 12. These impulses can be subtracted preferably by the integral formed in the PI-regulator 12, so that a reduced rise of the current increase or even a reduction of the current results. In this manner a back coupling is produced between the occurrence of arcs and the operating current for the glow discharge.

The output of the PI-regulator 12 supplies the desired value for the operating current $I_{desired}$.

In FIG. 2 the temperature $\theta$ is graphically illustrated relative to time t. The solid-line curve 20 shows a normal starting operation for a current-intensive glow discharge. The curve 20 climbs steadily and approaches the specified treatment temperature $\theta$.

In the dash line indicated region 22 the amplifier 13 operates as an amplifier, while it works as a comparator underneath the dashed region 22, since it is operated in saturation due to the great input voltage difference between $\theta$ and $\theta_{desired}$. Momentary interruptions of the starting process for the glow discharge process by the occuring arcs, which are operative by a switch operative in response thereto, lead to no interruptions in the curve 20, but on the contrary to a corresponding adjustment of the rise of this curve. By long time interruptions, as can be produced through different disturbances as momentary cooling water, e.g. during the time interval $t_1$ to $T_2$, can produce a cooling off the workpiece, which is illustrated by means of the dot dash dashed curve 21. The renewed heating at the time point $t_2$ begins then for the temperature which exists at the workpiece to be treated at this time point. The rising portion of the curve 21 extends thereby essentially parallel to the corresponding portion of the curve 20, and the frequency of the formation of arcs by the signals coming through the switch operative in response thereto by a back coupling is reduced to a minimum. In this manner the interruption of the heating process is maintained slight due to the requirements of this switch, so that a minimal time expense for the heating operation is achieved for the optimal careful treatment of the workpieces.

While the invention has been illustrated and described in the context of a method and an apparatus for the heating up of workpieces to a desired temperature, it is however not to be limited to the illustrated and described characteristics, different changes are also possible without departing from the context of the present invention.

I claim:

1. Apparatus for the automatic heating and adjustment of a predetermined treatment temperature of workpieces by means of current intensive glow discharge in a container, comprising: temperature measuring means in said container to deliver a value corresponding to the actual treatment temperature; means for supplying a comparison value corresponding to a desired treatment temperature; a differentiator having its input connected to said temperature measuring means to produce at its output a value corresponding to the time derivative of the actual treatment temperature; a comparator having one input connected to the output of said differentiator and the other input connected to said means for supplying the comparison value to produce at its output a control value corresponding to the difference between said time derivative of the actual temperature and the desired temperature; and a current regulator having its input connected to the output of said comparator to readjust the current in said container in response to said control value at the output of said comparator.

2. Apparatus as defined in claim 1, wherein said means for supplying said comparison value includes means for for supplying a fixed desired value and a second comparator whose first input is connected to said means for supplying said fixed desired value and whose second input is connected to said temperature measuring means, the outputs of said second comparator being connected to said other input of said first-mentioned comparator.

3. Apparatus as defined in claim 2, wherein said first and second comparator is an amplifier which goes into saturation for large input value differences.

4. Apparatus according to claim 3, wherein each comparator is an operational amplifier.

5. Apparatus as defined in claim 1 wherein said means for supplying a comparison value supplies a positive comparison value when the actual temperature is below a predetermined fixed value, and a negative comparison value upon exceeding said fixed value.

6. Apparatus according to claim 1 wherein the current regulator is a PI-regulator with a long integral action time.

7. Apparatus according to claim 1 wherein the current regulator comprises an additional input, through which impulses for the reduction of the current are conducted upon the occurrence of discharge disturbances as arcing.

* * * * *